(12) United States Patent
Saxena et al.

(10) Patent No.: US 11,465,650 B2
(45) Date of Patent: Oct. 11, 2022

(54) MODEL-FREE REINFORCEMENT LEARNING

(71) Applicant: Honda Motor Co., Ltd., Tokyo (JP)

(72) Inventors: Dhruv Mauria Saxena, Pittsburgh, PA (US); Sangjae Bae, Berkley, CA (US); Alireza Nakhaei Sarvedani, San Jose, CA (US); Kikuo Fujimura, Palo Alto, CA (US)

(73) Assignee: HONDA MOTOR CO., LTD., Tokyo (JP)

( * ) Notice: Subject to any disclaimer, the term of this patent is extended or adjusted under 35 U.S.C. 154(b) by 257 days.

(21) Appl. No.: 16/841,602

(22) Filed: Apr. 6, 2020

(65) Prior Publication Data

US 2021/0086798 A1 Mar. 25, 2021

Related U.S. Application Data

(60) Provisional application No. 62/903,678, filed on Sep. 20, 2019.

(51) Int. Cl.
*B60W 60/00* (2020.01)
*B60W 30/18* (2012.01)
(Continued)

(52) U.S. Cl.
CPC ...... *B60W 60/00276* (2020.02); *B60W 30/16* (2013.01); *B60W 30/18163* (2013.01);
(Continued)

(58) Field of Classification Search
CPC ...... B60W 60/00276; B60W 30/18163; G05D 1/0088; G05D 1/0221; G05D 2201/0212; G06N 3/08; G06F 30/27
See application file for complete search history.

(56) References Cited

U.S. PATENT DOCUMENTS

2019/0113929 A1\* 4/2019 Mukadam ............... G08G 1/167
2020/0090074 A1\* 3/2020 Isele ....................... G06F 30/20
(Continued)

FOREIGN PATENT DOCUMENTS

CN 109733415 A \* 5/2019

OTHER PUBLICATIONS

Zlatan Ajanovic, Bakir Lacevic, Barys Shyrokau, Michael Stolz, and Martin Horn. Search-based optimal motion planning for automated driving. In 2018 IEEE/RSJ International Conference on Intelligent Robots and Systems, IROS 2018, Madrid, Spain, Oct. 1-5, 2018, pp. 4523-4530, 2018.
(Continued)

*Primary Examiner* — Michael J Zanelli
(74) *Attorney, Agent, or Firm* — Rankin, Hill & Clark LLP

(57) ABSTRACT

A system for generating a model-free reinforcement learning policy may include a processor, a memory, and a simulator. The simulator may be implemented via the processor and the memory. The simulator may generate a simulated traffic scenario including two or more lanes, an ego-vehicle, a dead end position, and one or more traffic participants. The dead end position may be a position by which a lane change for the ego-vehicle may be desired. The simulated traffic scenario may be associated with an occupancy map, a relative velocity map, a relative displacement map, and a relative heading map at each time step within the simulated traffic scenario. The simulator may model the ego-vehicle and one or more of the traffic participants using a kinematic bicycle model. The simulator may build a policy based on the simulated traffic scenario using an actor-critic network. The policy may be implemented on an autonomous vehicle.

20 Claims, 7 Drawing Sheets

(51) Int. Cl.
   G05D 1/00      (2006.01)
   B60W 30/16     (2020.01)
   G05D 1/02      (2020.01)
   G06N 3/08      (2006.01)
   B60W 50/06     (2006.01)
(52) U.S. Cl.
   CPC .......... *B60W 50/06* (2013.01); *G05D 1/0088* (2013.01); *G05D 1/0221* (2013.01); *G06N 3/08* (2013.01); *G05D 2201/0212* (2013.01); *G05D 2201/0213* (2013.01)

(56) References Cited

U.S. PATENT DOCUMENTS

2020/0139973 A1* 5/2020 Palanisamy ............ G08G 1/167
2020/0363814 A1* 11/2020 He ....................... G06N 3/0454

OTHER PUBLICATIONS

Alexander Amini, Wilko Schwarting, Guy Rosman, Brandon Araki, Sertac Karaman, and Daniela Rus. Variational autoencoder for end-to-end control of autonomous driving with novelty detection and training de-biasing. In 2018 IEEE/RSJ International Conference on Intelligent Robots and Systems, IROS 2018, Madrid, Spain, Oct. 1-5, 2018, pp. 568-575, 2018.
Sangjae Bae, Dhruv Saxena, Alireza Nakhaei, Chiho Choi, Kikuo Fujimura, and Scott Moura. Cooperation-aware lane change control in dense traffic. CoRR, abs/1909.05665, 2019.
Mariusz Bojarski, Davide Del Testa, Daniel Dworakowski, Bernhard Firner, Beat Flepp, Prasoon Goyal, Lawrence D. Jackel, Mathew Monfort, Urs Muller, Jiakai Zhang, Xin Zhang, Jake Zhao, and Karol Zieba. End to end learning for self-driving cars. CoRR, abs/1604.07316, 2016.
Martin Buehler, Kari Iagnemma, and Sanjiv Singh, editors. The DARPA Urban Challenge: Autonomous Vehicles in City Traffic, George Air Force Base, Victorville, California, USA, vol. 56 of Springer Tracts in Advanced Robotics. Springer, 2009.
Chenyi Chen, Ari Seff, Alain Kornhauser, and Jianxiong Xiao. Deepdriving: Learning affordance for direct perception in autonomous driving. In Proceedings of the 2015 IEEE International Conference on Computer Vision (ICCV), ICCV '15, pp. 2722-2730, Washington, DC, USA, 2015. IEEE Computer Society.
Jianyu Chen, Bodi Yuan, and Masayoshi Tomizuka. Model-free deep reinforcement learning for urban autonomous driving. CoRR, abs/1904.09503, 2019.
Po-Wei Chou, Daniel Maturana, and Sebastian Scherer. Improving stochastic policy gradients in continuous control with deep reinforcement learning using the beta distribution. In Doina Precup and Yee Whye Teh, editors, Proceedings of the 34th International Conference on Machine Learning, vol. 70 of Proceedings of Machine Learning Research, pp. 834-843, International Convention Centre, Sydney, Australia, Aug. 6-11, 2017. PMLR.
Felipe Codevilla, Matthias Miiller, Antonio Lopez, Vladlen Koltun, and Alexey Dosovitskiy. End-to-end driving via conditional imitation learning. In 2018 IEEE International Conference on Robotics and Automation, ICRA 2018, Brisbane, Australia, May 21-25, 2018, pp. 1-9, 2018.
Jaime F. Fisac, Eli Bronstein, Elis Stefansson, Dorsa Sadigh, S. Shankar Sastry, and Anca D. Dragan. Hierarchical game-theoretic planning for autonomous vehicles. In International Conference on Robotics and Automation, ICRA 2019, Montreal, QC, Canada, May 20-24, 2019, pp. 9590-9596, 2019.
Mincent François-Lavet, Peter Henderson, Riashat Islam, Marc G Bellemare, Joelle Pineau, et al. An introduction to deep reinforcement learning. Foundations and Trends® in Machine Learning, 11(3-4):219-354, 2018.
Agrim Gupta, Justin Johnson, Li Fei-Fei, Silvio Savarese, and Alexandre Alahi. Social GAN: socially acceptable trajectories with generative adversarial networks. In 2018 IEEE Conference on Computer Vision and Pattern Recognition, CVPR 2018, Salt Lake City, UT, USA, Jun. 18-22, 2018, pp. 2255-2264, 2018.
Mikael Henaff, Alfredo Canziani, and Yann LeCun. Model-predictive policy learning with uncertainty regularization for driving in dense traffic. In 7th International Conference on Learning Representations, ICLR 2019, New Orleans, LA, USA, May 6-9, 2019, 2019.
Carl-Johan Hoel, Katherine Rose Driggs-Campbell, Krister Wolff, Leo Laine, and Mykel J. Kochenderfer. Combining planning and deep reinforcement learning in tactical decision making for autonomous driving. CoRR, abs/1905.02680, 2019.
Thomas M. Howard and Alonzo Kelly. Optimal rough terrain trajectory generation for wheeled mobile robots. I. J. Robotics Res., 26(2):141-166, 2007.
Yeping Hu, Alireza Nakhaei, Masayoshi Tomizuka, and Kikuo Fujimura. Interaction-aware decision making with adaptive strategies under merging scenarios. CoRR, abs/1904.06025, 2019.
J. Hwangbo, I. Sa, R. Siegwart, and M. Hutter. Control of a quadrotor with reinforcement learning. IEEE Robotics and Automation Letters, 2(4):2096-2103, Oct. 2017.
Jemin Hwangbo, Joonho Lee, Alexey Dosovitskiy, Dario Bellicoso, Vassilios Tsounis, Vladlen Koltun, and Marco Hutter. Learning agile and dynamic motor skills for legged robots. Science Robotics, 4(26), 2019.
Christos Katrakazas, Mohammed Quddus, Wen-Hua Chen, and Lipika Deka. Real-time motion planning methods for autonomous on-road driving: State-of-the-art and future research directions. Transportation Research Part C: Emerging Technologies, 60:416-442, 2015.
J. Kong, M. Pfeiffer, G. Schildbach, and F. Borrelli. Kinematic and dynamic vehicle models for autonomous driving control design. In 2015 IEEE Intelligent Vehicles Symposium (IV), pp. 1094-1099, Jun. 2015.
Alex Kuefler, Jeremy Morton, Tim Allan Wheeler, and Mykel J. Kochenderfer. Imitating driver behavior with generative adversarial networks. In IEEE Intelligent Vehicles Symposium, IV 2017, Los Angeles, CA, USA, Jun. 11-14, 2017, pp. 204-211, 2017.
Jesse Levinson, Jake Askeland, Jan Becker, Jennifer Dolson, David Held, Soeren Kammel, J Zico Kolter, Dirk Langer, Oliver Pink, Vaughan Pratt, et al. Towards fully autonomous driving: Systems and algorithms. In 2011 IEEE Intelligent Vehicles Symposium (IV), pp. 163-168. IEEE, 2011.
Timothy P Lillicrap, Jonathan J Hunt, Alexander Pritzel, Nicolas Heess, Tom Erez, Yuval Tassa, David Silver, and Daan Wierstra. Continuous control with deep reinforcement learning. arXiv preprint arXiv:1509.02971, 2015.
Liang Ma, Jianru Xue, Kuniaki Kawabata, Jihua Zhu, Chao Ma, and Nanning Zheng. Efficient sampling-based motion planning for on-road autonomous driving. IEEE Trans. Intelligent Transportation Systems, 16(4):1961-1976, 2015.
Brian Paden, Michal Cáp, Sze Zheng Yong, Dmitry S. Yershov, and Emilio Frazzoli. A survey of motion planning and control techniques for self-driving urban vehicles. IEEE Trans. Intelligent Vehicles, 1(1):33-55, 2016.
Dean Pomerleau. Alvinn: An autonomous land vehicle in a neural network. In D.S. Touretzky, editor, Advances in Neural Information Processing Systems 1. Morgan Kaufmann, Jan. 1989.
Dorsa Sadigh, Shankar Sastry, Sanjit A. Seshia, and Anca D. Dragan. Planning for autonomous cars that leverage effects on human actions. In Robotics: Science and Systems XII, University of Michigan, Ann Arbor, Michigan, USA, Jun. 18-22, 2016, 2016.
John Schulman, Filip Wolski, Prafulla Dhariwal, Alec Radford, and Oleg Klimov. Proximal policy optimization algorithms. arXiv preprint arXiv:1707.06347, 2017.
W. Schwarting, J. Alonso-Mora, L. Pauli, S. Karaman, and D. Rus. Parallel autonomy in automated vehicles: Safe motion generation with minimal intervention. In 2017 IEEE International Conference on Robotics and Automation (ICRA), pp. 1928-1935, May 2017.
Wilko Schwarting, Javier Alonso-Mora, and Daniela Rus. Planning and decision-making for autonomous vehicles. Annual Review of Control, Robotics, and Autonomous Systems, 1(1):187-210, 2018.

(56) References Cited

OTHER PUBLICATIONS

Shai Shalev-Shwartz, Shaked Shammah, and Amnon Shashua. Safe, multi-agent, reinforcement learning for autonomous driving. CoRR, abs/1610.03295, 2016.
P. Trautman and A. Krause. Unfreezing the robot: Navigation in dense, interacting crowds. In 2010 IEEE/RSJ International Conference on Intelligent Robots and Systems, pp. 797-803, Oct. 2010.
Martin Treiber, Ansgar Hennecke, and Dirk Helbing. Congested traffic states in empirical observations and microscopic simulations. Phys. Rev. E, 62:1805-1824, Aug. 2000.
Martin Treiber and Arne Kesting. Modeling lane-changing decisions with mobil. In Cécile Appert-Rolland, François Chevoir, Philippe Gondret, Sylvain Lassarre, Jean-Patrick Lebacque, and Michael Schreckenberg, editors, Traffic and Granular Flow '07, pp. 211-221, Berlin, Heidelberg, 2009. Springer Berlin Heidelberg.
S. Ulbrich, S. Grossjohann, C. Appelt, K. Homeier, J. Rieken, and M. Maurer. Structuring cooperative behavior planning implementations for automated driving. In 2015 IEEE 18th International Conference on Intelligent Transportation Systems, pp. 2159-2165, Sep. 2015.
Peter Wolf, Christian Hubschneider, Michael Weber, Andre Bauer, Jonathan Hartl, Fabian Durr, and Johann Marius Zöllner. Learning how to drive in a real world simulation with deep q-networks. In IEEE Intelligent Vehicles Symposium, IV 2017, Los Angeles, CA, USA, Jun. 11-14, 2017, pp. 244-250, 2017.
Wenda Xu, Junqing Wei, John M. Dolan, Huijing Zhao, and Hongbin Zha. A real-time motion planner with trajectory optimization for autonomous vehicles. In IEEE International Conference on Robotics and Automation, ICRA 2012, May 14-18, 2012, St. Paul, Minnesota, USA, pp. 2061-2067, 2012.

\* cited by examiner

MODEL-FREE REINFORCEMENT LEARNING

CROSS-REFERENCE TO RELATED APPLICATIONS

This application claims the benefit of U.S. Provisional Patent Application, Ser. No. 62/903,678 entitled "DRIVING IN DENSE TRAFFIC WITH MODEL-FREE REINFORCEMENT LEARNING", filed on Sep. 20, 2019; the entirety of the above-noted application(s) is incorporated by reference herein.

BACKGROUND

Traditional planning and control methods may fail to find a feasible trajectory for an autonomous vehicle to execute amongst dense traffic on roads. This may be because the obstacle-free volume in space-time is very small in these scenarios for the vehicle to drive through.

BRIEF DESCRIPTION

According to one aspect, a system for generating a model-free reinforcement learning policy may include a processor, a memory, and a simulator. The simulator may be implemented via the processor and the memory. The simulator may perform generating a simulated traffic scenario including two or more lanes, an ego-vehicle, a dead end position, and one or more traffic participants. The dead end position may be a position by which a lane change for the ego-vehicle may be desired. The simulated traffic scenario may be associated with an occupancy map, a relative velocity map, a relative displacement map, and a relative heading map at each time step within the simulated traffic scenario. The simulator may perform modeling the ego-vehicle and one or more of the traffic participants using a kinematic bicycle model. The simulator may perform building a policy based on the simulated traffic scenario using an actor-critic network. The policy may be implemented on an autonomous vehicle.

The occupancy map, the relative velocity map, the relative displacement map, and the relative heading map at each time step within the simulated traffic scenario may be fed as inputs to the actor-critic network. A state space and an action space associated with building the policy based on the simulated traffic scenario may be continuous spaces. The simulator may simulate stop-and-go traffic scenarios within the simulated traffic scenario for the one or more traffic participants and the ego-vehicle. The simulated traffic scenario, the occupancy map, the relative velocity map, the relative displacement map, or the relative heading map may be associated with a number of vehicles, a desired velocity for the ego-vehicle, an initial distance to one or more of the traffic participants from the ego-vehicle, a distance to the dead end position from the ego-vehicle, a cooperativeness parameter associated with each traffic participant, a perception range associated with each traffic participant, the time step, a number of lanes, a vehicle width for each vehicle or traffic participant, and a vehicle length for each vehicle or traffic participant.

Each kinematic bicycle model for each corresponding vehicle or traffic participant may be associated with a set of spatial coordinates, a heading, a velocity, a local frame angle of velocity vector, an angle of tires, and an acceleration. The actor-critic network may include a multilayer perceptron (MLP) or a feedforward artificial neural network (ANN). The actor-critic network may include one or more convolution layers. A reward function associated with a critic of the simulator may be based on a desired velocity for the ego-vehicle, a acceleration rate associated with the ego-vehicle, a steering rate associated with the ego-vehicle, and a distance to the dead end position from the ego-vehicle. The acceleration rate associated with the ego-vehicle and the steering rate associated with the ego-vehicle may be indicative of an action executed at a previous time step for the ego-vehicle.

According to one aspect, a method for generating a model-free reinforcement learning policy may include generating a simulated traffic scenario including two or more lanes, an ego-vehicle, a dead end position, and one or more traffic participants, the dead end position may be a position by which a lane change for the ego-vehicle may be desired, the simulated traffic scenario may be associated with an occupancy map, a relative velocity map, a relative displacement map, and a relative heading map at each time step within the simulated traffic scenario, modeling the ego-vehicle and one or more of the traffic participants using a kinematic bicycle model, building a policy based on the simulated traffic scenario using an actor-critic network, and implementing the policy on an autonomous vehicle.

The occupancy map, the relative velocity map, the relative displacement map, and the relative heading map at each time step within the simulated traffic scenario may be fed as inputs to the actor-critic network. A state space and an action space associated with building the policy based on the simulated traffic scenario may be continuous spaces. The method for generating the model-free reinforcement learning policy may include simulating stop-and-go traffic scenarios within the simulated traffic scenario for the one or more traffic participants and the ego-vehicle. The simulated traffic scenario, the occupancy map, the relative velocity map, the relative displacement map, or the relative heading map may be associated with a number of vehicles, a desired velocity for the ego-vehicle, an initial distance to one or more of the traffic participants from the ego-vehicle, a distance to the dead end position from the ego-vehicle, a cooperativeness parameter associated with each traffic participant, a perception range associated with each traffic participant, the time step, a number of lanes, a vehicle width for each vehicle or traffic participant, and a vehicle length for each vehicle or traffic participant.

Each kinematic bicycle model for each corresponding vehicle or traffic participant may be associated with a set of spatial coordinates, a heading, a velocity, a local frame angle of velocity vector, an angle of tires, and an acceleration. The actor-critic network may include a multilayer perceptron (MLP) or a feedforward artificial neural network (ANN). A reward function associated with a critic of a simulator may be based on a desired velocity for the ego-vehicle, a acceleration rate associated with the ego-vehicle, a steering rate associated with the ego-vehicle, and a distance to the dead end position from the ego-vehicle. The acceleration rate associated with the ego-vehicle and the steering rate associated with the ego-vehicle may be indicative of an action executed at a previous time step for the ego-vehicle.

According to one aspect, an autonomous vehicle implementing a model-free reinforcement learning policy may include a processor, a memory storing a policy built on a simulator, and a controller. The policy built on the simulator may be built by generating a simulated traffic scenario including two or more lanes, an ego-vehicle, a dead end position, and one or more traffic participants, the dead end position may be a position by which a lane change for the ego-vehicle may be desired, the simulated traffic scenario may be associated with an occupancy map, a relative velocity map, a relative displacement map, and a relative heading map at each time step within the simulated traffic scenario, modeling the ego-vehicle and one or more of the traffic participants using a kinematic bicycle model, and building the policy based on the simulated traffic scenario using an actor-critic network. The controller may implement the policy on one or more actuators of the autonomous vehicle.

DETAILED DESCRIPTION

Figure 1:
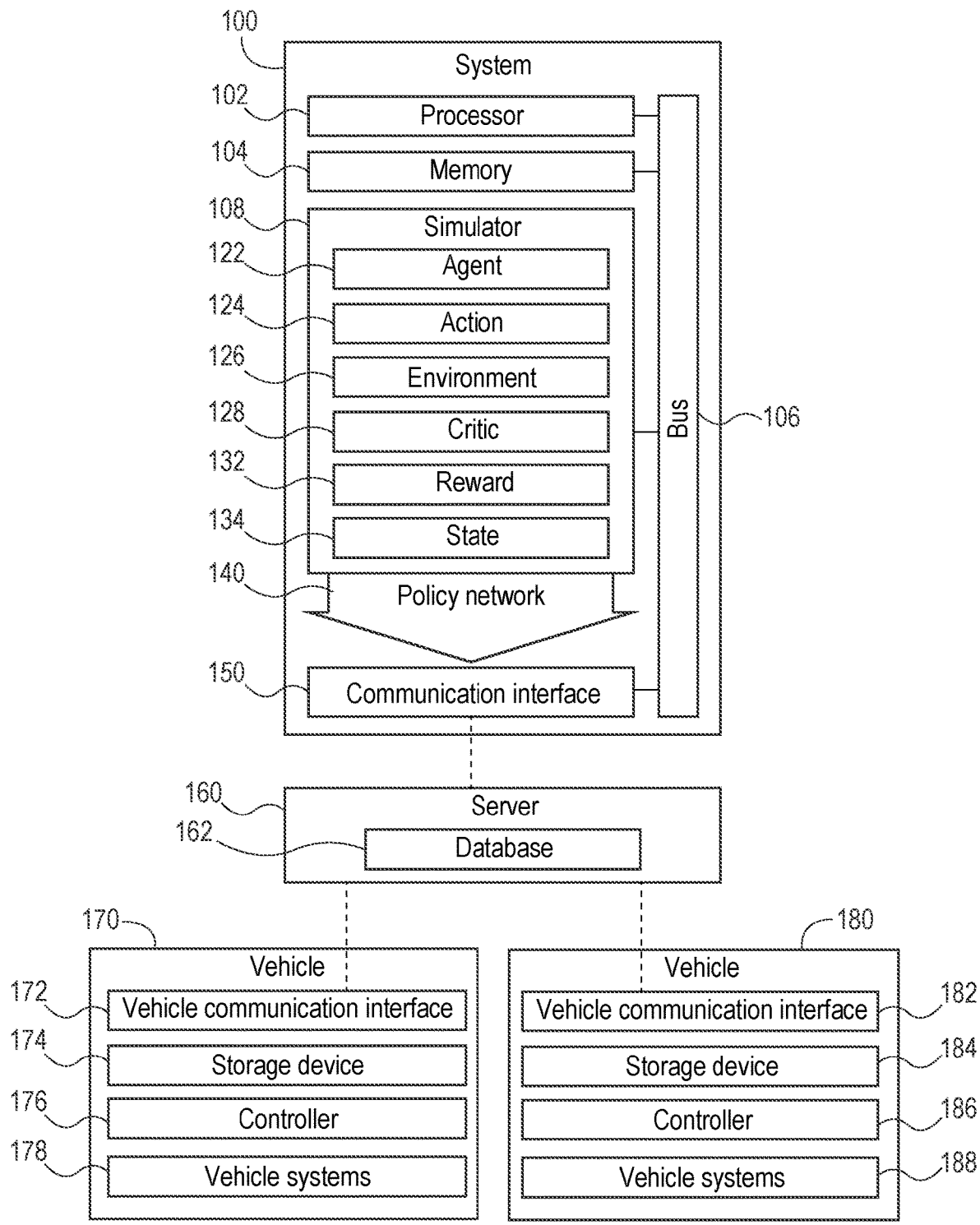
FIG. 1 is an exemplary component diagram of a system for model-free reinforcement learning, according to one aspect.

The following includes definitions of selected terms employed herein. The definitions include various examples and/or forms of components that fall within the scope of a term and that may be used for implementation. The examples are not intended to be limiting. Further, one having ordinary skill in the art will appreciate that the components discussed herein, may be combined, omitted or organized with other components or organized into different architectures.

A "processor", as used herein, processes signals and performs general computing and arithmetic functions. Signals processed by the processor may include digital signals, data signals, computer instructions, processor instructions, messages, a bit, a bit stream, or other means that may be received, transmitted, and/or detected. Generally, the processor may be a variety of various processors including multiple single and multicore processors and co-processors and other multiple single and multicore processor and co-processor architectures. The processor may include various modules to execute various functions.

A "memory", as used herein, may include volatile memory and/or non-volatile memory. Non-volatile memory may include, for example, ROM (read only memory), PROM (programmable read only memory), EPROM (erasable PROM), and EEPROM (electrically erasable PROM). Volatile memory may include, for example, RAM (random access memory), synchronous RAM (SRAM), dynamic RAM (DRAM), synchronous DRAM (SDRAM), double data rate SDRAM (DDRSDRAM), and direct RAM bus RAM (DRRAM). The memory may store an operating system that controls or allocates resources of a computing device.

A "disk" or "drive", as used herein, may be a magnetic disk drive, a solid state disk drive, a floppy disk drive, a tape drive, a Zip drive, a flash memory card, and/or a memory stick. Furthermore, the disk may be a CD-ROM (compact disk ROM), a CD recordable drive (CD-R drive), a CD rewritable drive (CD-RW drive), and/or a digital video ROM drive (DVD-ROM). The disk may store an operating system that controls or allocates resources of a computing device.

A "bus", as used herein, refers to an interconnected architecture that is operably connected to other computer components inside a computer or between computers. The bus may transfer data between the computer components. The bus may be a memory bus, a memory controller, a peripheral bus, an external bus, a crossbar switch, and/or a local bus, among others. The bus may also be a vehicle bus that interconnects components inside a vehicle using protocols such as Media Oriented Systems Transport (MOST), Controller Area network (CAN), Local Interconnect Network (LIN), among others.

A "database", as used herein, may refer to a table, a set of tables, and a set of data stores (e.g., disks) and/or methods for accessing and/or manipulating those data stores.

An "operable connection", or a connection by which entities are "operably connected", is one in which signals, physical communications, and/or logical communications may be sent and/or received. An operable connection may include a wireless interface, a physical interface, a data interface, and/or an electrical interface.

A "computer communication", as used herein, refers to a communication between two or more computing devices (e.g., computer, personal digital assistant, cellular telephone, network device) and may be, for example, a network transfer, a file transfer, an applet transfer, an email, a hypertext transfer protocol (HTTP) transfer, and so on. A computer communication may occur across, for example, a wireless system (e.g., IEEE 802.11), an Ethernet system (e.g., IEEE 802.3), a token ring system (e.g., IEEE 802.5), a local area network (LAN), a wide area network (WAN), a point-to-point system, a circuit switching system, a packet switching system, among others.

A "mobile device", as used herein, may be a computing device typically having a display screen with a user input (e.g., touch, keyboard) and a processor for computing. Mobile devices include handheld devices, portable electronic devices, smart phones, laptops, tablets, and e-readers.

A "vehicle", as used herein, refers to any moving vehicle that is capable of carrying one or more human occupants and is powered by any form of energy. The term "vehicle" includes cars, trucks, vans, minivans, SUVs, motorcycles, scooters, boats, personal watercraft, and aircraft. In some scenarios, a motor vehicle includes one or more engines. Further, the term "vehicle" may refer to an electric vehicle (EV) that is powered entirely or partially by one or more electric motors powered by an electric battery. The EV may include battery electric vehicles (BEV) and plug-in hybrid electric vehicles (PHEV). Additionally, the term "vehicle" may refer to an autonomous vehicle and/or self-driving vehicle powered by any form of energy. The autonomous vehicle may or may not carry one or more human occupants.

An "agent", as used herein, may refer to a "vehicle", such as an ego-vehicle within a simulation or a simulated vehicle, as well as other traffic participants. Similarly, "actor" as used herein, may be used interchangeably with "agent" which may also be the ego-vehicle being simulated or other traffic participants being simulated. Additionally, "setting" as used herein, may be used interchangeably with "environment". A, "feature" as used herein, may include a goal.

A "vehicle system", as used herein, may be any automatic or manual systems that may be used to enhance the vehicle, driving, and/or safety. Exemplary vehicle systems include an autonomous driving system, an electronic stability control system, an anti-lock brake system, a brake assist system, an automatic brake prefill system, a low speed follow system, a cruise control system, a collision warning system, a collision mitigation braking system, an auto cruise control system, a lane departure warning system, a blind spot indicator system, a lane keep assist system, a navigation system, a transmission system, brake pedal systems, an electronic power steering system, visual devices (e.g., camera systems, proximity sensor systems), a climate control system, an electronic pretensioning system, a monitoring system, a passenger detection system, a vehicle suspension system, a vehicle seat configuration system, a vehicle cabin lighting system, an audio system, a sensory system, among others.

The aspects discussed herein may be described and implemented in the context of non-transitory computer-readable storage medium storing computer-executable instructions. Non-transitory computer-readable storage media include computer storage media and communication media. For example, flash memory drives, digital versatile discs (DVDs), compact discs (CDs), floppy disks, and tape cassettes. Non-transitory computer-readable storage media may include volatile and non-volatile, removable and non-removable media implemented in any method or technology for storage of information such as computer readable instructions, data structures, modules, or other data.

FIG. 1 is an exemplary component diagram of a system for model-free reinforcement learning, according to one aspect. The system 100 for generating a model-free reinforcement learning policy may include a processor 102, a memory 104, a bus 106 communicatively coupling one or more of the components of FIG. 1, and a simulator 108. The simulator 108 may be implemented via the processor 102 and the memory 104. The simulator 108 may simulate or perform simulation associated with one or more agents 122 (e.g., which may be ego-vehicles herein), taking one or more actions 124, within a simulation environment 126, where one or more critics 128 interpret or evaluate one or more of the actions 124 taken by one or more of the agents 122 to determine one or more rewards 132 and one or more states 134 resulting from the actions taken.

The simulator 108 or the processor 102 may generate a policy network 140, which may be stored on the memory 104 of the system 100 for generating a model-free reinforcement learning policy. The system may further include a communication interface 150 which enables the policy network 140 to be transmitted to other devices, such as a server 160, which may include a database 162. In this way, the policy network 140 generated by the system 100 for generating a model-free reinforcement learning policy may be stored on the database 162 of the server 160. Discussion regarding greater detail associated with the building of the policy network 140 may be provided herein (e.g., FIGS. 3-6).

The server may then propagate the policy network 140 to one or more vehicles, such as a first vehicle 170 and a second vehicle 180. The first vehicle may be equipped with a vehicle communication interface 172, a storage device 174, a controller 176, and one or more vehicle systems 178, which may include actuators and/or sensors, for example. The storage device may store the policy network 140 from the server, and the controller may operate the first vehicle in an autonomous fashion based on the policy network 140. Similarly, the second vehicle 180 may be equipped with a vehicle communication interface 182, a storage device 184, a controller 186, and one or more vehicle systems 188 (e.g., including actuators, etc.), and may operate similarly to the first vehicle. In this way, the sensors of the vehicle systems 178, 188 may detect obstacles or traffic participants and provide those as inputs (e.g., observations) to the policy network 140 developed by the simulator 108, which may then provide a suggested action for the vehicle 170, 180, etc.

In any event, when the policy network 140 is stored on the storage device of the vehicle, this enables the controller to autonomously drive the vehicle around based on the policy network 140, and to make autonomous driving decisions according to the generating a model-free reinforcement learning policy which occurred within the simulator 108 because the policy network 140 may be indicative of one or more of the policies or decisions which should be made based on the training or the simulation. For example, the network policy may receive an input of an observation associated with the first autonomous vehicle or the second autonomous vehicle (e.g., a vehicle state or an environment state) and output a suggested action.

Figure 2:
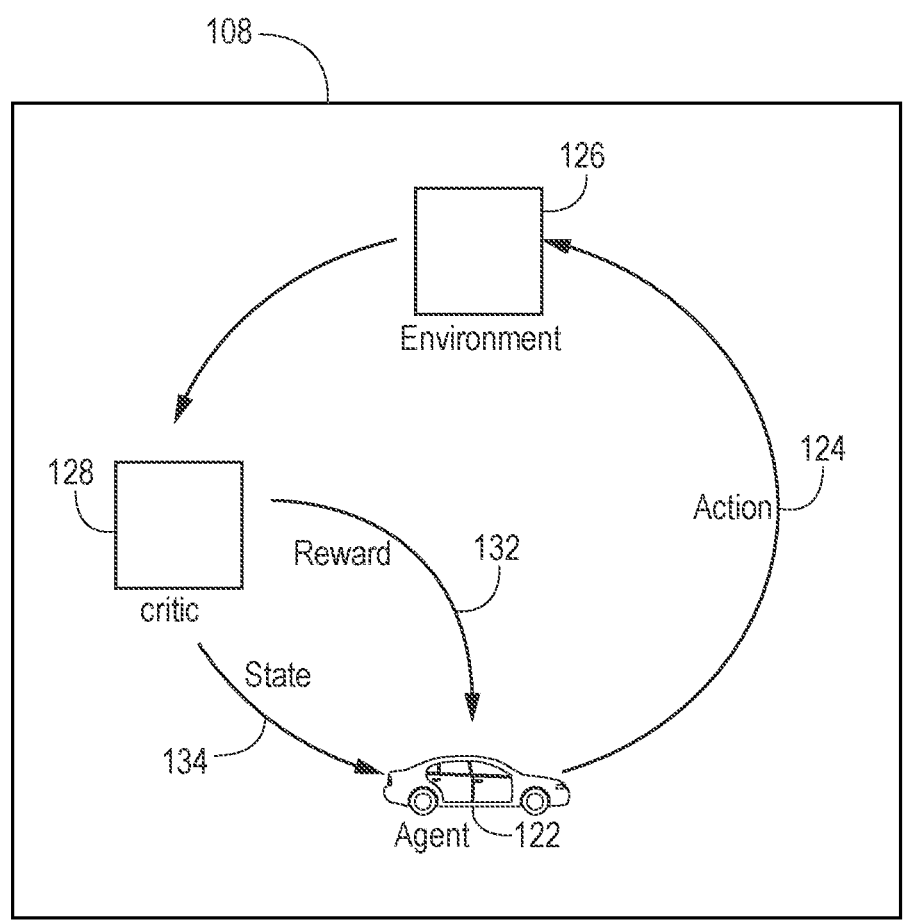
FIG. 2 is an exemplary component diagram of a system for model-free reinforcement learning, according to one aspect.

FIG. 2 is an exemplary component diagram of a system for model-free reinforcement learning of FIG. 1, according to one aspect. In FIG. 2, the simulator 108 of the system 100 for generating a model-free reinforcement learning policy of FIG. 1 may be seen. Here, the agent 122 may take the action 124 in the environment 126. This may be interpreted, by the critic 128, as the reward 132 or penalty and a representation of the state 134, which may be then fed back into the agent 122. The agent 122 may interact with the environment 126 by taking the action 124 at a discrete time step. At each time step, the agent 122 may receive an observation which may include the reward 132. The agent 122 may determine an action 124, which results in a new state 134 and a new reward 132 for a subsequent time step. The goal of the agent 122 is generally to collect the greatest amount of rewards 132 possible.

Model-Free

Generally, in reinforcement learning, a model has a very specific meaning as in a model may refer to the different dynamic states of an environment and how these states lead to a reward. A policy may be a strategy generated to determine actions to take based on a current state. The overall outcome of reinforcement learning (or other types of learning) may be to develop a policy. Explained again, the policy may be a series of behaviors or actions to take when presented with a specific domain. Reinforcement may be applied by continually re-running or re-executing the learning process based on the results of prior learning, effectively updating an old policy with a newer policy to learn from the results and to improve the policy. In model based reinforcement learning, a model may be utilized to represent the environment or domain to indicate states and possible actions. By knowing states, the policies may target these states and actions specifically in each repetition cycle, testing and improving the accuracy of the policy, to improve the quality of the model. The policy, on the other hand, may be the learnings on the behaviors, where as the model may include the facts or scenario states that back up and confirm the learnings. According to one aspect, model-free reinforcement learning may be provided to build the policy. The policy may take information associated with a traffic scenario (e.g., an occupancy map, a relative velocity map, a relative displacement map, and a relative heading map, as will be discussed herein) and output a suggestion action for the autonomous vehicle, such as a steering value and an acceleration value, for example.

For autonomous driving, since the behavior of other drivers may not be known, this joint interaction behavior may be implicitly learned by utilizing the ability of deep reinforcement learning to learn complex policies from the data. While explicitly modeling human interactions could elicit better behaviors from learned policies, the policy may be built in a model free fashion to mitigate capturing interactions from each traffic participant at each time step, which reduces the associated computational cost for the system.

Simulation

The simulator 108 may simulate stop-and-go traffic scenarios within the simulated traffic scenario for the one or more traffic participants and the ego-vehicle, such as by including stop-and-go behavior that cycles between a non-zero and zero desired velocity in regular time intervals. Additionally, any of the traffic participants may engage in random lane changes. The simulator 108 may perform generating a simulated traffic scenario including two or more lanes, an ego-vehicle (e.g., agent), a dead end position, which may be associated with a traffic participant or vehicle, and one or more traffic participants. The dead end position may be a position by which a lane change for the ego-vehicle may be desired. For example, the agent may attempt to negotiate and open a gap in the road between other vehicles or traffic participants in order to successfully merge or change lanes. The simulation enables the policy 140 to learn to repeatedly probe into a target road lane while finding a safe spot to move into. Within the simulated traffic scenario, the agent may be the ego-vehicle (although other scenarios are possible where the agent may be the other traffic participants). In this way, the simulation may be associated with a number of vehicles, gaps between respective vehicles or traffic participants, desired velocities of respective traffic participants, and the distance between the ego-vehicle and the dead end (e.g., dead end distance).

A state space and an action space associated with building the policy 140 based on the simulated traffic scenario may be continuous spaces rather than selecting an action from a discretized action space. In this way, the simulator 108 of the system 100 may enable minimization of acceleration associated with a generated trajectory (e.g., associated with the suggested action) to be achieved, thereby providing smoother motion and/or acceleration for autonomous vehicle operation. In this way, the policy 140 generated by the simulator 108 may be a continuous control policy over the action space for the autonomous vehicle. Thus, policy gradient optimization may be used to directly learn the policy 140 over the state space in association with continuous control reinforcement learning, rather than learning a value function and using the value function to derive the policy 140.

The simulated traffic scenario may be associated with an occupancy map, a relative velocity map, a relative displacement map, and a relative heading map at each time step within the simulated traffic scenario.

According to one aspect, the system 100 may maximize the following objective via gradient ascent:

$$\nabla_\theta J(\theta) = \mathbb{E}_{T \sim \pi_\theta(\tau)}[(\Sigma_{t=1}^T \nabla_\theta \log \pi_\theta(a_t|s_t))(\tau_{t=1}^T r(a_t, s_t))]$$

where $\tau$ may be a trajectory, $\pi_\theta(\tau)$ may be the likelihood of executing that trajectory under the current policy $\pi_\theta$, $\pi_\theta(a_t|s_t)$ may be the probability of executing action $a_t$ from state $s_t$, and $r(a_t; s_t)$ is the reward gained for that execution.

Other simulated traffic scenario parameters may include $N \in \mathbb{Z}$, a number of vehicles within the simulated traffic scenario, $v^{des} \in \mathbb{R}$, desired velocity, $s_0 \in \mathbb{R}$, an initial gap or distance from the ego-vehicle to a traffic participant vehicle in front or directly in front of the ego-vehicle, $s_D \in \mathbb{R}$, a dead end distance from the ego-vehicle to the dead end position or location, $p_c \in \mathbb{R}$, cooperativeness associated with a traffic participant vehicle, $\lambda_0 \in \mathbb{R}$, a perception range associated with a traffic participant vehicle, $\Delta t$, a simulation time step, $L$, a number of lanes on the roadway, $l$ a length of a vehicle, and $w$, a width of a vehicle.

The cooperativeness $p_c$ and perception range parameters $\lambda_p$ may respectively control whether a vehicle slows down to cooperate with another vehicle. Each vehicle on the road can perceive vehicles in its lateral field-of-view, which may include the width of its lane plus an extra width represented by $\Delta_p$. For any other vehicle that may be inside this field-of-view, the vehicle decides whether to slow down, e.g., cooperate, with probability $p_c$ at every time step $\Delta t$, where $p_c = 1$ may be used for vehicles within $w$ of the lateral field-of-view to enforce full cooperation with vehicles directly in front of the ego-vehicle.

In order to elicit complex behaviors from other vehicles or traffic participants on the road that reflect those seen on real roads, different levels of cooperativeness ($\lambda_c$), and also the fact that these behaviors vary over time ($p_c$) may be simulated.

Vehicle Model

The simulator 108 may perform modeling the ego-vehicle and one or more of the traffic participants using a kinematic bicycle model. Each kinematic bicycle model for each corresponding vehicle or traffic participant may be associated with a set of spatial coordinates, a heading, a velocity, a local frame angle of velocity vector, an angle of tires, and an acceleration. The nonlinear equations of motion for this model may be written as:

$$\dot{x} = v \cos(\varphi + \beta)$$

$$\dot{y} = v \sin(\varphi + \beta)$$

$$\dot{\varphi} = \frac{v}{l_r} \sin(\beta)$$

$$\dot{v} = a$$

$$\beta = \arctan\left(\frac{l_r}{l_f + l_r} \tan(\delta_f)\right)$$

Relative to a global inertial frame, $(x; y)$ may be the spatial coordinates of a vehicle, $\varphi$ may be the heading, and $v$ may be the velocity vector. In the local frame of the vehicle, $\beta$ may be the angle of the velocity vector, $\delta_f$ may be the angle of the front tires, and $a$ may be the acceleration. $l_r$ and $l_f$ may be the distances of the rear and front tires respectively from the center of the vehicle. The steering angle $\delta_f$ and acceleration $a$ may be the control inputs for the system 100. It may be assumed that the steering angle of the rear tires $\delta_r = 0$. A diagram of the kinematic bicycle model for four-wheel vehicles can be seen in FIG. 4.

Network Architecture

The simulator 108 may perform building a policy based on the simulated traffic scenario using an actor-critic network. The actor-critic network may include a first layer that may be utilized to make a decision and a second layer which may criticize the decision by determining whether the decision was good or bad, for example. The actor-critic network may include a multilayer perceptron (MLP) or a feedforward artificial neural network (ANN). The actor-critic network may include one or more convolution layers. This actor-critic network may be a framework that facilitates decision making for the autonomous vehicle when there is uncertainty in a dense traffic scenario where a merge into a dense traffic is desired, for example. In other words, the autonomous vehicle or system may make assumptions about whether other drivers or traffic participants will allow the autonomous vehicle to make a lane change into the desired lane.

Parameterization

An actor-critic style network that may be trained using Proximal Policy Optimization (PPO) may be implemented by the simulator 108. Training may occur with or without sharing parameters between the actor network and the critic network. The task of autonomous driving may be one of continuous control since the acceleration and steering angle may be continuously controlled for the vehicle. To achieve smooth behaviors with high enough fidelity via discrete control may greatly increase the size of the action space, thereby making discrete control methods intractable.

For autonomous driving, the comfort of the passengers may be considered as a factor. Learning a policy over the acceleration and steering angle of a vehicle may lead to oscillatory behavior which may be undesirable. Instead, the network may be trained by the simulator 108 to predict the time derivatives of these quantities, e.g., jerk or acceleration j and steering rate b, enabling maintenance a smooth signal over the true low-level control variables.

The policy 140 may be parameterized as Beta distributions for j and $\dot{\delta}$. This enables training to be more stable as the policy 140 gradients may be unbiased with respect to the finite support of the Beta distribution. Each action may be scaled to acceptable dynamic limits for j and $\dot{\delta}$ inside the simulator 108. According to one aspect, for j, values may be within the range $[-4.0; 2.0]$ m/s$^3$, whereas $\dot{\delta}$ can vary between $$[-0.4, 0.4] \frac{\text{rad}}{\text{s}},$$

for example.

Ego-Vehicle Observations

The occupancy map, the relative velocity map, the relative displacement map, and the relative heading map at each time step within the simulated traffic scenario may be fed as inputs to the actor-critic network. Explained another way, the four layers (although more or fewer layers may be utilized) of the occupancy map, the relative velocity map, the relative displacement map, and the relative heading map may be stacked and provided the input to the network. The simulated traffic scenario, the occupancy map, the relative velocity map, the relative displacement map, or the relative heading map may be associated with a number of vehicles, a desired velocity for the ego-vehicle, an initial distance to one or more of the traffic participants from the ego-vehicle, a distance to the dead end position from the ego-vehicle, a cooperativeness parameter associated with each traffic participant, a perception range associated with each traffic participant, the time step, a number of lanes, a vehicle width for each vehicle or traffic participant, and a vehicle length for each vehicle or traffic participant.

Due to the large number of vehicles that may be considered neighbors of the ego-vehicle at any time, and the fact that this number may change over time, the input representation may be agnostic to this number. Additionally, in order to capture the complex inter-vehicle interactions on the road, the input observations include information about the dynamic states of neighboring vehicles.

An occupancy-grid style observation that may be controlled by one parameter e.g., the longitudinal field-of-view (FoV) of the ego-vehicle may be utilized by the simulator 108. In the real-world, on-board sensors and perception systems from the vehicle systems may process the raw data to determine the relative poses and velocities of neighboring vehicles. In the simulations, at each time step, the simulator 108 may process the simulator 108 state to calculate an observation tensor of size 4×3×(2×FoV+1). There may be one channel (e.g., a first dimension) each for on-road occupancy, relative velocities of vehicles, relative lateral displacements, and relative headings with respect to the ego-vehicle. The rows (e.g., a second dimension) may represent the lanes on the road (e.g., left lane, current lane, right lane for the ego-vehicle).

An ego-vehicle specific feature vector may be included as part of the observation. This includes the distance to the dead end (d(deadend)), an indicator for whether the ego-vehicle may be in the target lane $\mathbb{I}\{\text{lane}\}$), lateral displacement and relative heading from the centerline of the target lane (t and ø), current velocity, acceleration, and steering angle (v, a, and δ), and the action executed at the last time step (j and $\dot{\delta}$).

Reward Function

A reward function associated with a critic of the simulator 108 may be based on a desired velocity for the ego-vehicle, a acceleration rate associated with the ego-vehicle, a steering rate associated with the ego-vehicle, and a distance to the dead end position from the ego-vehicle. The acceleration rate associated with the ego-vehicle and the steering rate associated with the ego-vehicle may be indicative of an action executed at a previous time step for the ego-vehicle.

The reward function may include three sets of terms: R1, R2, R3.

R1 may be associated with having the ego-vehicle be closely oriented with a centerline of the target lane, and travel close to a desired speed.

R2 may be associated with mitigating unpredictable or oscillatory driving behavior, as to maximize passenger comfort.

R3 may be associated with an upcoming dead end, and facilitate a finish the lane change maneuver sooner rather than later.

The reward function by taking these design choices into consideration. The reward per (state, action) pair may be:

$$R1 \begin{cases} r(a_t, s_t) = 0 - \lambda_v \cdot |v - v_{des}| \\ \quad - \lambda_t \cdot |t| \\ \quad - \lambda\_\emptyset \cdot |\emptyset| \cdot \mathbb{I}\{\text{lane}\} \end{cases}$$

$$R2 \begin{cases} -\lambda_j \cdot J \\ -\lambda_\delta \cdot \delta \end{cases}$$

$$R3 \begin{cases} +1 \cdot \|\{lane\} \\ +f(deadend) \end{cases}$$

$v_{des}$ may be the desired velocity for the ego-vehicle, and $f$(deadend) may reward or penalize the agent according to ego-vehicle's lane and distance to dead end.

Figure 3:
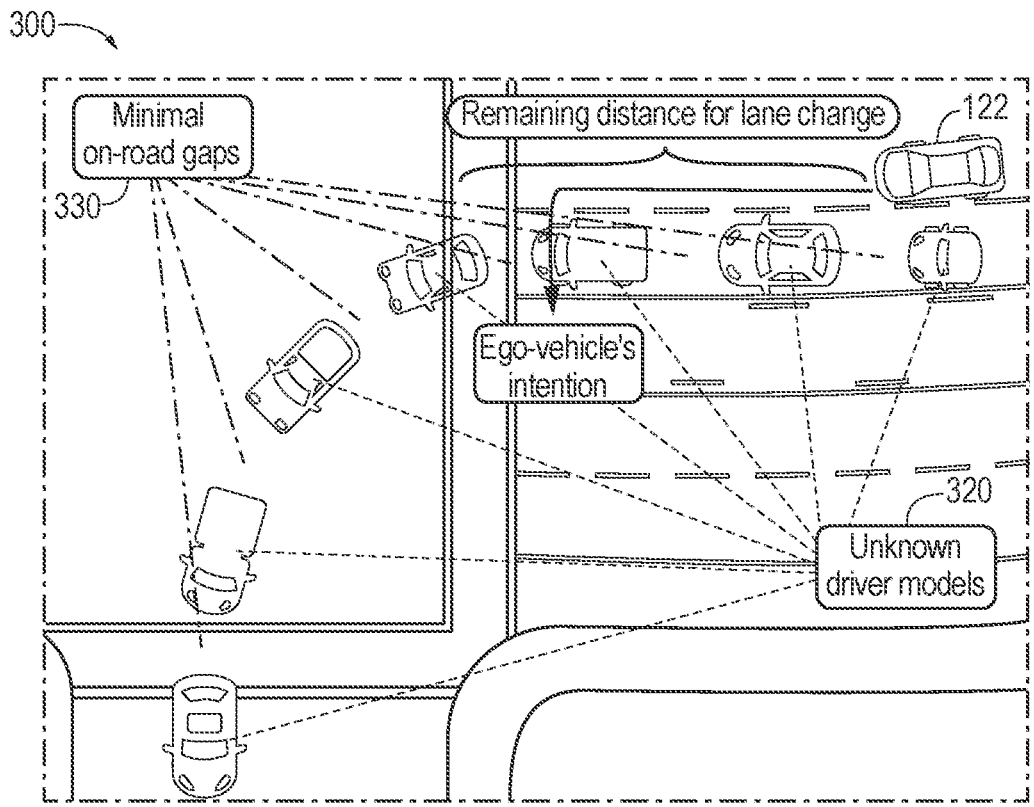
FIG. 3 is an exemplary traffic scenario where a system for model-free reinforcement learning may be implemented, according to one aspect.

FIG. 3 is an exemplary traffic scenario where a system for model-free reinforcement learning may be implemented, according to one aspect. The generated network policy may be implemented on an autonomous vehicle, such as the autonomous vehicle of FIG. 3. In FIG. 3, the ego-vehicle or agent may be attempting to merge or make a lane change, such as a left lane change where many unknown drivers 320 are associated with different gaps 330, in order to make a left turn. Generally, goal-directed behavior may rely on some level of cooperation between various agents on the road in order to achieve the desired goal. The goal for the ego-vehicle may be to change into the left lane before the intersection so that the ego-vehicle may make a legal left turn. However, the dense traffic on the road makes difficult for the ego-vehicle to convince another vehicle (e.g., traffic participant) in the other lane to give the ego-vehicle room in order to successfully change lanes. As seen in FIG. 3, there is a remaining distance for the lane change. This distance may be referred to as the 'dead end distance'.

Figure 4:
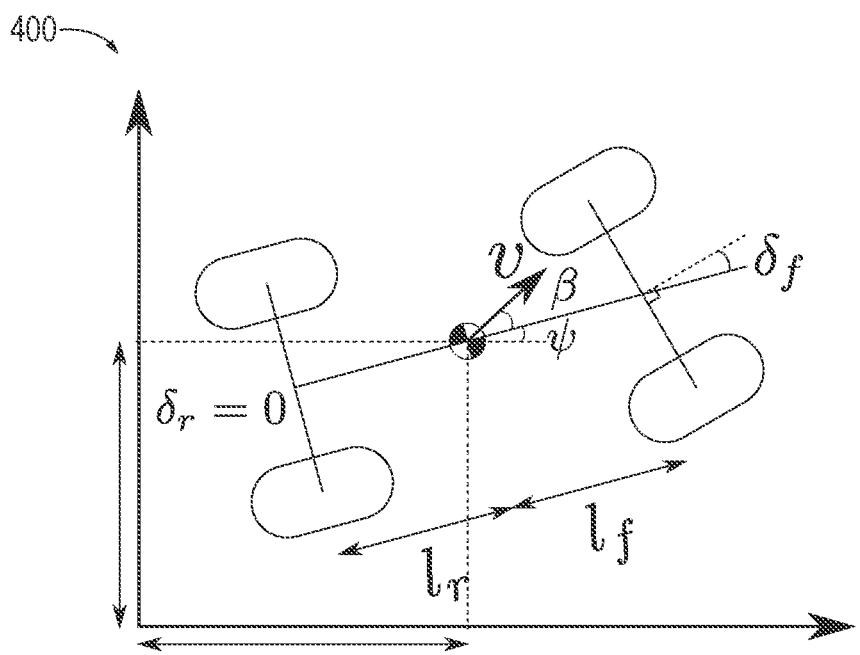
FIG. 4 is an exemplary kinematic bicycle model associated with a system for model-free reinforcement learning, according to one aspect.

FIG. 4 is an exemplary kinematic bicycle model 400 associated with a system for model-free reinforcement learning, according to one aspect.

Figure 5:
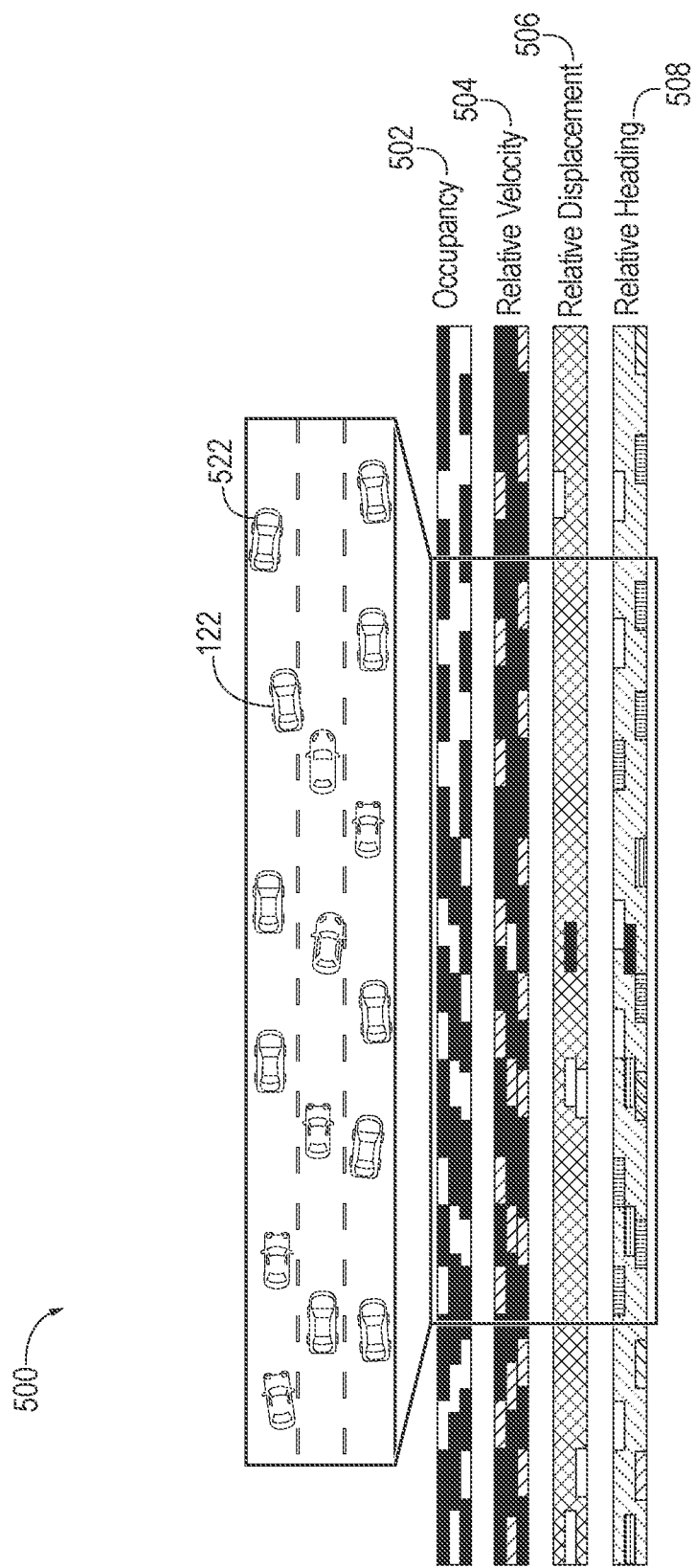
FIG. 5 is an exemplary traffic scenario where a system for model-free reinforcement learning may be implemented, according to one aspect.

FIG. 5 is an exemplary traffic scenario 500 where a system for model-free reinforcement learning may be implemented, according to one aspect. Similarly to simulation, a real-world traffic scenario may be indicated using an occupancy map 502, a relative velocity map 504, a relative displacement map 506, and a relative heading map 508 at each time step within the real-world traffic scenario based on data collected from vehicle sensors (e.g., vehicle systems 178, 188). In this way, an exemplary real-world state (during execution) or simulator state (during training) and corresponding input observation used for the network may be provided.

Figure 6:
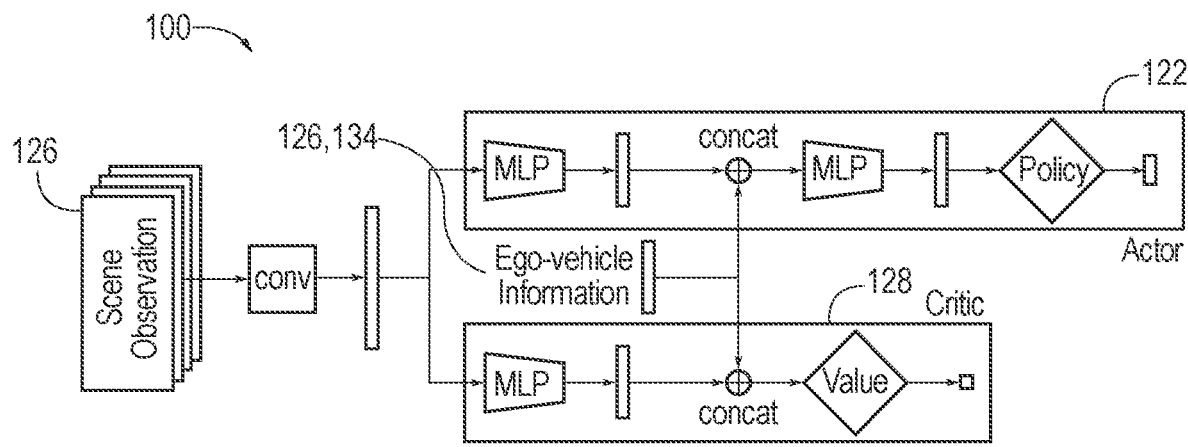
FIG. 6 is an exemplary component diagram of a system for model-free reinforcement learning, according to one aspect.

FIG. 6 is an exemplary component diagram of a system for model-free reinforcement learning, according to one aspect. The actor-critic network may include a first layer associated with an actor (e.g., agent, ego-vehicle, etc.) that may be utilized to make a decision and a second layer (e.g., critic) which may criticize the decision by determining whether the decision was good or bad, for example. The actor-critic network may include a multilayer perceptron (MLP) or a feedforward artificial neural network (ANN). The actor-critic network may include one or more convolution layers. It may be seen in FIG. 6 that the ego-vehicle information, such as environment information 126 pertaining to the ego-vehicle or state-information 134 pertaining to the ego-vehicle (e.g., velocity, steering value, acceleration, etc.) may be input to the actor-critic network.

Figure 7:
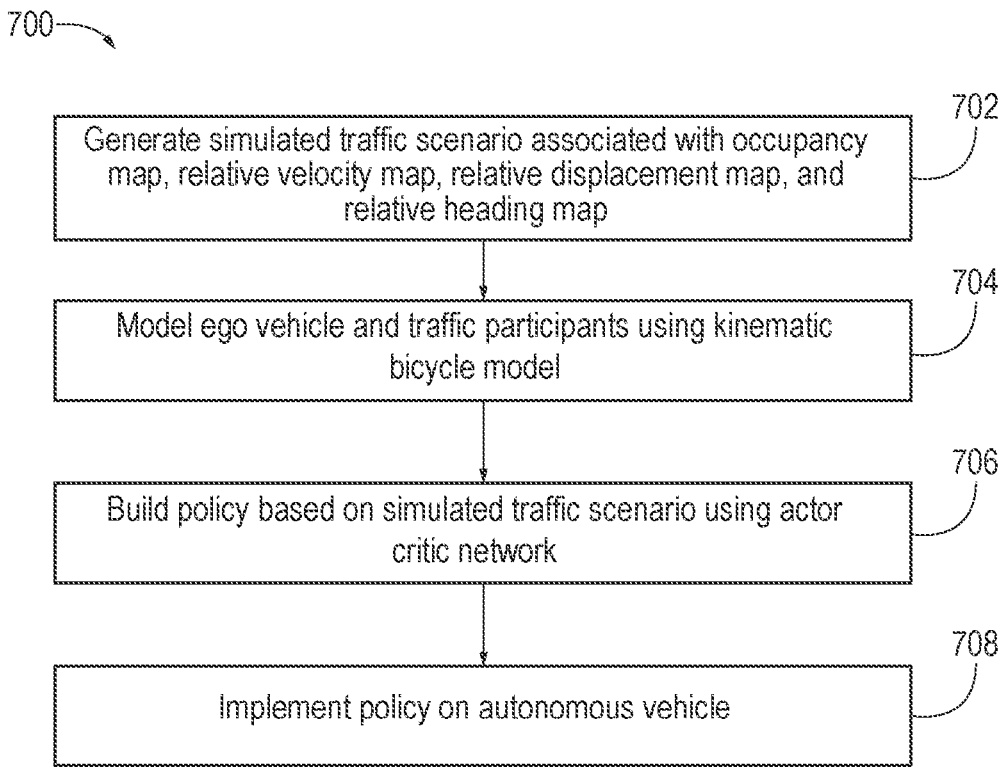
FIG. 7 is an exemplary flow diagram of a method for model-free reinforcement learning, according to one aspect.

FIG. 7 is an exemplary flow diagram of a method 700 for model-free reinforcement learning, according to one aspect. The method 700 for model-free reinforcement learning may include generating 702 a simulated traffic scenario including two or more lanes, an ego-vehicle, a dead end position, and one or more traffic participants. The dead end position may be a position by which a lane change for the ego-vehicle may be desired, the simulated traffic scenario may be associated with an occupancy map, a relative velocity map, a relative displacement map, and a relative heading map at each time step within the simulated traffic scenario. The method 700 may include modeling 704 the ego-vehicle and one or more of the traffic participants using a kinematic bicycle model, building 706 a policy based on the simulated traffic scenario using an actor-critic network, and implementing 708 the policy on an autonomous vehicle.

Figure 8:
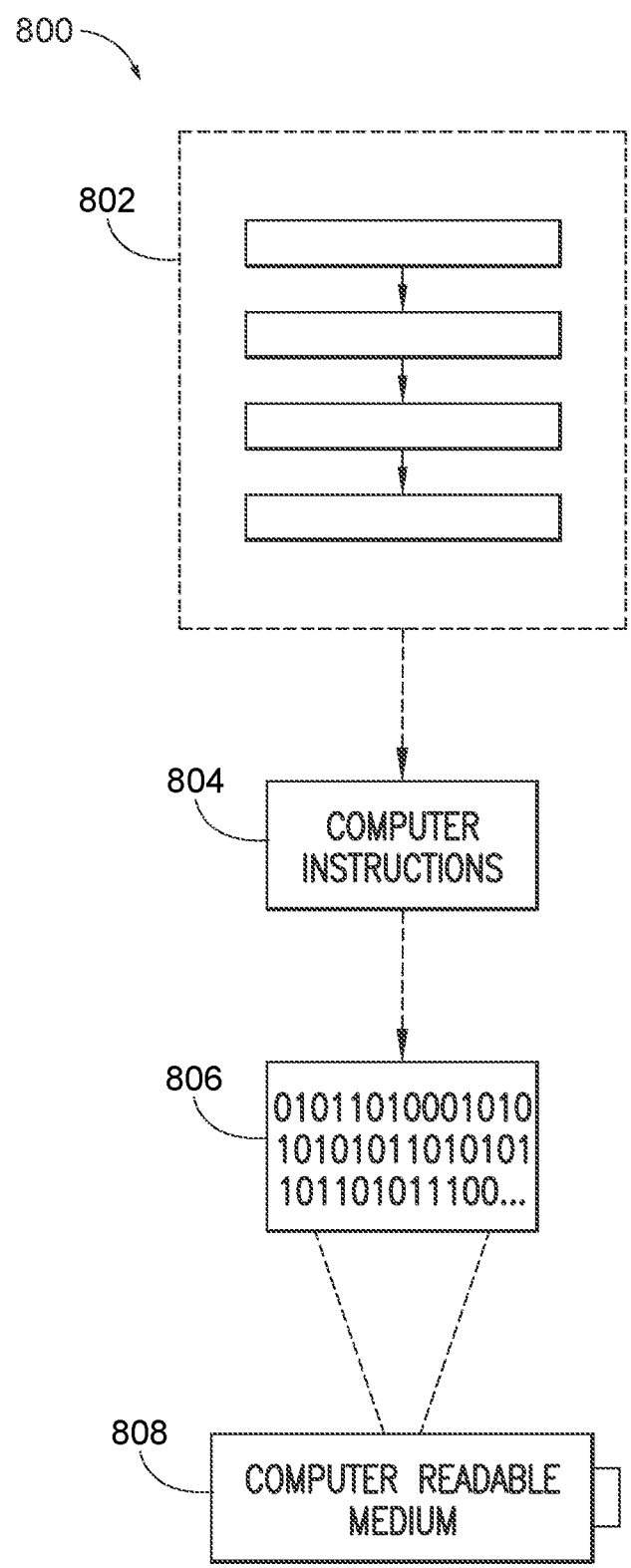
FIG. 8 is an illustration of an example computer-readable medium or computer-readable device including processor-executable instructions configured to embody one or more of the provisions set forth herein, according to one aspect.

Still another aspect involves a computer-readable medium including processor-executable instructions configured to implement one aspect of the techniques presented herein. An aspect of a computer-readable medium or a computer-readable device devised in these ways is illustrated in FIG. 8, wherein an implementation 800 includes a computer-readable medium 808, such as a CD-R, DVD-R, flash drive, a platter of a hard disk drive, etc., on which is encoded computer-readable data 806. This encoded computer-readable data 806, such as binary data including a plurality of zero's and one's as shown in 806, in turn includes a set of processor-executable computer instructions 804 configured to operate according to one or more of the principles set forth herein. In this implementation 800, the processor-executable computer instructions 804 may be configured to perform a method 802, such as the method 700 of FIG. 7. In another aspect, the processor-executable computer instructions 804 may be configured to implement a system, such as the system 100 of FIG. 1. Many such computer-readable media may be devised by those of ordinary skill in the art that are configured to operate in accordance with the techniques presented herein.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processing unit, an object, an executable, a thread of execution, a program, or a computer. By way of illustration, both an application running on a controller and the controller may be a component. One or more components residing within a process or thread of execution and a component may be localized on one computer or distributed between two or more computers.

Further, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 9:
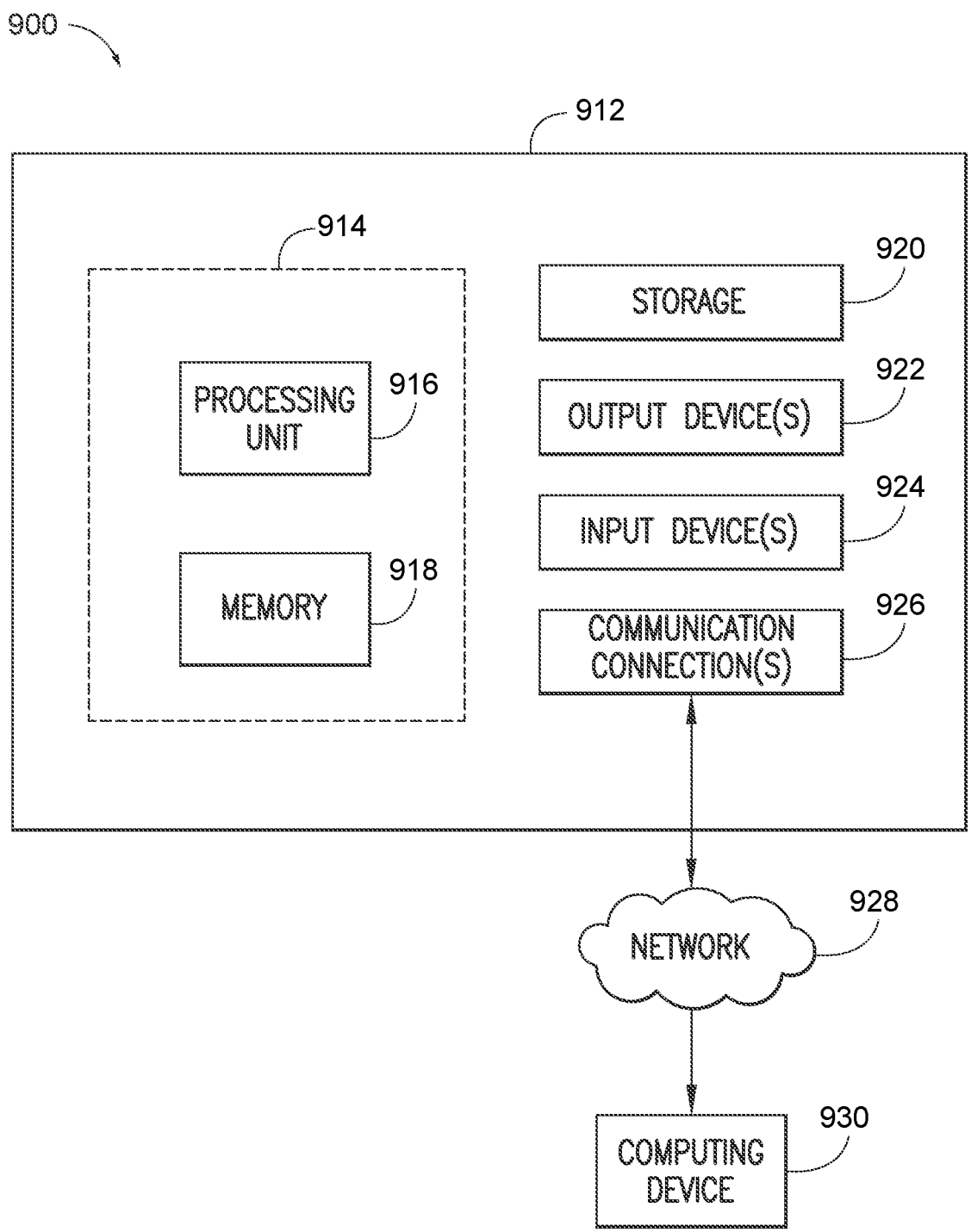
FIG. 9 is an illustration of an example computing environment where one or more of the provisions set forth herein are implemented, according to one aspect.

FIG. 9 and the following discussion provide a description of a suitable computing environment to implement aspects of one or more of the provisions set forth herein. The operating environment of FIG. 9 is merely one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, etc.

Generally, aspects are described in the general context of "computer readable instructions" being executed by one or more computing devices. Computer readable instructions may be distributed via computer readable media as will be discussed below. Computer readable instructions may be implemented as program modules, such as functions, objects, Application Programming Interfaces (APIs), data structures, and the like, that perform one or more tasks or implement one or more abstract data types. Typically, the functionality of the computer readable instructions are combined or distributed as desired in various environments.

FIG. 9 illustrates a system 900 including a computing device 912 configured to implement one aspect provided herein. In one configuration, the computing device 912 includes at least one processing unit 916 and memory 918. Depending on the exact configuration and type of computing device, memory 918 may be volatile, such as RAM, non-volatile, such as ROM, flash memory, etc., or a combination of the two. This configuration is illustrated in FIG. 9 by dashed line 914.

In other aspects, the computing device 912 includes additional features or functionality. For example, the computing device 912 may include additional storage such as removable storage or non-removable storage, including, but not limited to, magnetic storage, optical storage, etc. Such additional storage is illustrated in FIG. 9 by storage 920. In one aspect, computer readable instructions to implement one aspect provided herein are in storage 920. Storage 920 may store other computer readable instructions to implement an operating system, an application program, etc. Computer readable instructions may be loaded in memory 918 for execution by processing unit 916, for example.

The term "computer readable media" as used herein includes computer storage media. Computer storage media includes volatile and nonvolatile, removable and non-removable media implemented in any method or technology for storage of information such as computer readable instructions or other data. Memory 918 and storage 920 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which may be used to store the desired information and which may be accessed by the computing device 912. Any such computer storage media is part of the computing device 912.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

The computing device 912 includes input device(s) 924 such as keyboard, mouse, pen, voice input device, touch input device, infrared cameras, video input devices, or any other input device. Output device(s) 922 such as one or more displays, speakers, printers, or any other output device may be included with the computing device 912. Input device(s) 924 and output device(s) 922 may be connected to the computing device 912 via a wired connection, wireless connection, or any combination thereof. In one aspect, an input device or an output device from another computing device may be used as input device(s) 924 or output device(s) 922 for the computing device 912. The computing device 912 may include communication connection(s) 926 to facilitate communications with one or more other devices 930, such as through network 928, for example.

Although the subject matter has been described in language specific to structural features or methodological acts, it is to be understood that the subject matter of the appended claims is not necessarily limited to the specific features or acts described above. Rather, the specific features and acts described above are disclosed as example aspects.

Various operations of aspects are provided herein. The order in which one or more or all of the operations are described should not be construed as to imply that these operations are necessarily order dependent. Alternative ordering will be appreciated based on this description. Further, not all operations may necessarily be present in each aspect provided herein.

As used in this application, "or" is intended to mean an inclusive "or" rather than an exclusive "or". Further, an inclusive "or" may include any combination thereof (e.g., A, B, or any combination thereof). In addition, "a" and "an" as used in this application are generally construed to mean "one or more" unless specified otherwise or clear from context to be directed to a singular form. Additionally, at least one of A and B and/or the like generally means A or B or both A and B. Further, to the extent that "includes", "having", "has", "with", or variants thereof are used in either the detailed description or the claims, such terms are intended to be inclusive in a manner similar to the term "comprising".

Further, unless specified otherwise, "first", "second", or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel. Additionally, "comprising", "comprises", "including", "includes", or the like generally means comprising or including, but not limited to.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A system for generating a model-free reinforcement learning policy, comprising:
   a processor;
   a memory; and
   a simulator implemented via the processor and the memory, performing:
   generating a simulated traffic scenario including two or more lanes, an ego-vehicle, a dead end position, and one or more traffic participants, wherein the dead end position is a position by which a lane change for the ego-vehicle is desired,
   wherein the simulated traffic scenario is associated with an occupancy map, a relative velocity map, a relative displacement map, and a relative heading map at each time step within the simulated traffic scenario;

modeling the ego-vehicle and one or more of the traffic participants within the simulated traffic scenario using a kinematic bicycle model; and building a policy based on the simulated traffic scenario using an actor-critic network, wherein the policy is implemented on an autonomous vehicle.

2. The system for generating the model-free reinforcement learning policy of claim 1, wherein the simulator simulates stop-and-go traffic scenarios within the simulated traffic scenario for the one or more traffic participants and the ego-vehicle.

3. The system for generating the model-free reinforcement learning policy of claim 1, wherein a state space and an action space associated with building the policy based on the simulated traffic scenario are continuous spaces.

4. The system for generating the model-free reinforcement learning policy of claim 1, wherein the simulated traffic scenario, the occupancy map, the relative velocity map, the relative displacement map, or the relative heading map are associated with a number of vehicles, a desired velocity for the ego-vehicle, an initial distance to one or more of the traffic participants from the ego-vehicle, a distance to the dead end position from the ego-vehicle, a cooperativeness parameter associated with each traffic participant, a perception range associated with each traffic participant, the time step, a number of lanes, a vehicle width for each vehicle or traffic participant, and a vehicle length for each vehicle or traffic participant.

5. The system for generating the model-free reinforcement learning policy of claim 1, wherein each kinematic bicycle model for each corresponding vehicle or traffic participant is associated with a set of spatial coordinates, a heading, a velocity, a local frame angle of velocity vector, an angle of tires, and an acceleration.

6. The system for generating the model-free reinforcement learning policy of claim 1, wherein the actor-critic network includes a multilayer perceptron (MLP) or a feed-forward artificial neural network (ANN).

7. The system for generating the model-free reinforcement learning policy of claim 1, wherein a reward function associated with a critic of the simulator is based on a desired velocity for the ego-vehicle, an acceleration rate associated with the ego-vehicle, a steering rate associated with the ego-vehicle, and a distance to the dead end position from the ego-vehicle.

8. The system for generating the model-free reinforcement learning policy of claim 7, wherein the acceleration rate associated with the ego-vehicle and the steering rate associated with the ego-vehicle are indicative of an action executed at a previous time step for the ego-vehicle.

9. The system for generating the model-free reinforcement learning policy of claim 1, wherein the actor-critic network includes one or more convolution layers.

10. The system for generating the model-free reinforcement learning policy of claim 1, wherein the occupancy map, the relative velocity map, the relative displacement map, and the relative heading map at each time step within the simulated traffic scenario are fed as inputs to the actor-critic network.

11. A method for generating a model-free reinforcement learning policy, comprising:

generating a simulated traffic scenario including two or more lanes, an ego-vehicle, a dead end position, and one or more traffic participants, wherein the dead end position is a position by which a lane change for the ego-vehicle is desired, wherein the simulated traffic scenario is associated with an occupancy map, a relative velocity map, a relative displacement map, and a relative heading map at each time step within the simulated traffic scenario;

modeling the ego-vehicle and one or more of the traffic participants within the simulated traffic scenario using a kinematic bicycle model;

building a policy based on the simulated traffic scenario using an actor-critic network; and implementing the policy on an autonomous vehicle.

12. The method for generating the model-free reinforcement learning policy of claim 11, comprising simulating stop-and-go traffic scenarios within the simulated traffic scenario for the one or more traffic participants and the ego-vehicle.

13. The method for generating the model-free reinforcement learning policy of claim 11, wherein a state space and an action space associated with building the policy based on the simulated traffic scenario are continuous spaces.

14. The method for generating the model-free reinforcement learning policy of claim 11, wherein the simulated traffic scenario, the occupancy map, the relative velocity map, the relative displacement map, or the relative heading map are associated with a number of vehicles, a desired velocity for the ego-vehicle, an initial distance to one or more of the traffic participants from the ego-vehicle, a distance to the dead end position from the ego-vehicle, a cooperativeness parameter associated with each traffic participant, a perception range associated with each traffic participant, the time step, a number of lanes, a vehicle width for each vehicle or traffic participant, and a vehicle length for each vehicle or traffic participant.

15. The method for generating the model-free reinforcement learning policy of claim 11, wherein each kinematic bicycle model for each corresponding vehicle or traffic participant is associated with a set of spatial coordinates, a heading, a velocity, a local frame angle of velocity vector, an angle of tires, and an acceleration.

16. The method for generating the model-free reinforcement learning policy of claim 11, wherein the actor-critic network includes a multilayer perceptron (MLP) or a feed-forward artificial neural network (ANN).

17. The method for generating the model-free reinforcement learning policy of claim 11, wherein a reward function associated with a critic of a simulator is based on a desired velocity for the ego-vehicle, an acceleration rate associated with the ego-vehicle, a steering rate associated with the ego-vehicle, and a distance to the dead end position from the ego-vehicle.

18. The method for generating the model-free reinforcement learning policy of claim 17, wherein the acceleration rate associated with the ego-vehicle and the steering rate associated with the ego-vehicle are indicative of an action executed at a previous time step for the ego-vehicle.

19. The method for generating the model-free reinforcement learning policy of claim 11, wherein the occupancy map, the relative velocity map, the relative displacement map, and the relative heading map at each time step within the simulated traffic scenario are fed as inputs to the actor-critic network.

20. An autonomous vehicle implementing a model-free reinforcement learning policy, comprising:

a processor;

a memory storing a policy built on a simulator by:

generating a simulated traffic scenario including two or more lanes, an ego-vehicle, a dead end position, and one or more traffic participants, wherein the dead end position is a position by which a lane change for the ego-vehicle is desired,
wherein the simulated traffic scenario is associated with an occupancy map, a relative velocity map, a relative displacement map, and a relative heading map at each time step within the simulated traffic scenario;
modeling the ego-vehicle and one or more of the traffic participants within the simulated traffic scenario using a kinematic bicycle model;
building the policy based on the simulated traffic scenario using an actor-critic network; and
a controller implementing the policy on one or more actuators of the autonomous vehicle.

* * * * *